(12) United States Patent
Rockwell et al.

(10) Patent No.: US 6,593,750 B2
(45) Date of Patent: *Jul. 15, 2003

(54) INTERFACE FOR CABLE TESTING

(75) Inventors: Kenneth N. Rockwell, Yorba Linda, CA (US); Roy G. Brant, Lake Arrowhead, CA (US)

(73) Assignee: Eubanks Engineering Co., Monrovia, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/197,350

(22) Filed: Jul. 16, 2002

(65) Prior Publication Data

US 2003/0001588 A1 Jan. 2, 2003

Related U.S. Application Data

(63) Continuation of application No. 09/898,281, filed on Jul. 2, 2001, now Pat. No. 6,420,881, which is a continuation-in-part of application No. 09/253,553, filed on Feb. 19, 1999, now Pat. No. 6,255,828.

(51) Int. Cl.$^7$ .............................................. G01R 31/02
(52) U.S. Cl. ...................................................... 324/539
(58) Field of Search .............................. 324/539, 158.1, 324/765, 756, 761, 755, 538; 361/386; 439/217, 402, 76, 497

(56) References Cited

U.S. PATENT DOCUMENTS

| 6,255,828 B1 | * | 7/2001 | Rockwell et al. ........... 324/539 |
| 6,420,881 B2 | * | 7/2002 | Rockwell et al. ........... 324/539 |

* cited by examiner

*Primary Examiner*—Kamand Cuneo
*Assistant Examiner*—Jimmy Nguyen
(74) *Attorney, Agent, or Firm*—William W. Haefliger

(57) ABSTRACT

In circuit tester apparatus using one or more carrier elements, each carrier element having one or more first electrical connectors, the combination comprising one or more base sections, one or more second electrical connectors carried by the section or sections and positioned to interfit the one or more first electrical connectors when the element or elements are assembled to the section or sections, at least two of the multiple base sections located for bridging thereof by at least one carrier element. Carrier elements may comprise adapter cards.

4 Claims, 9 Drawing Sheets

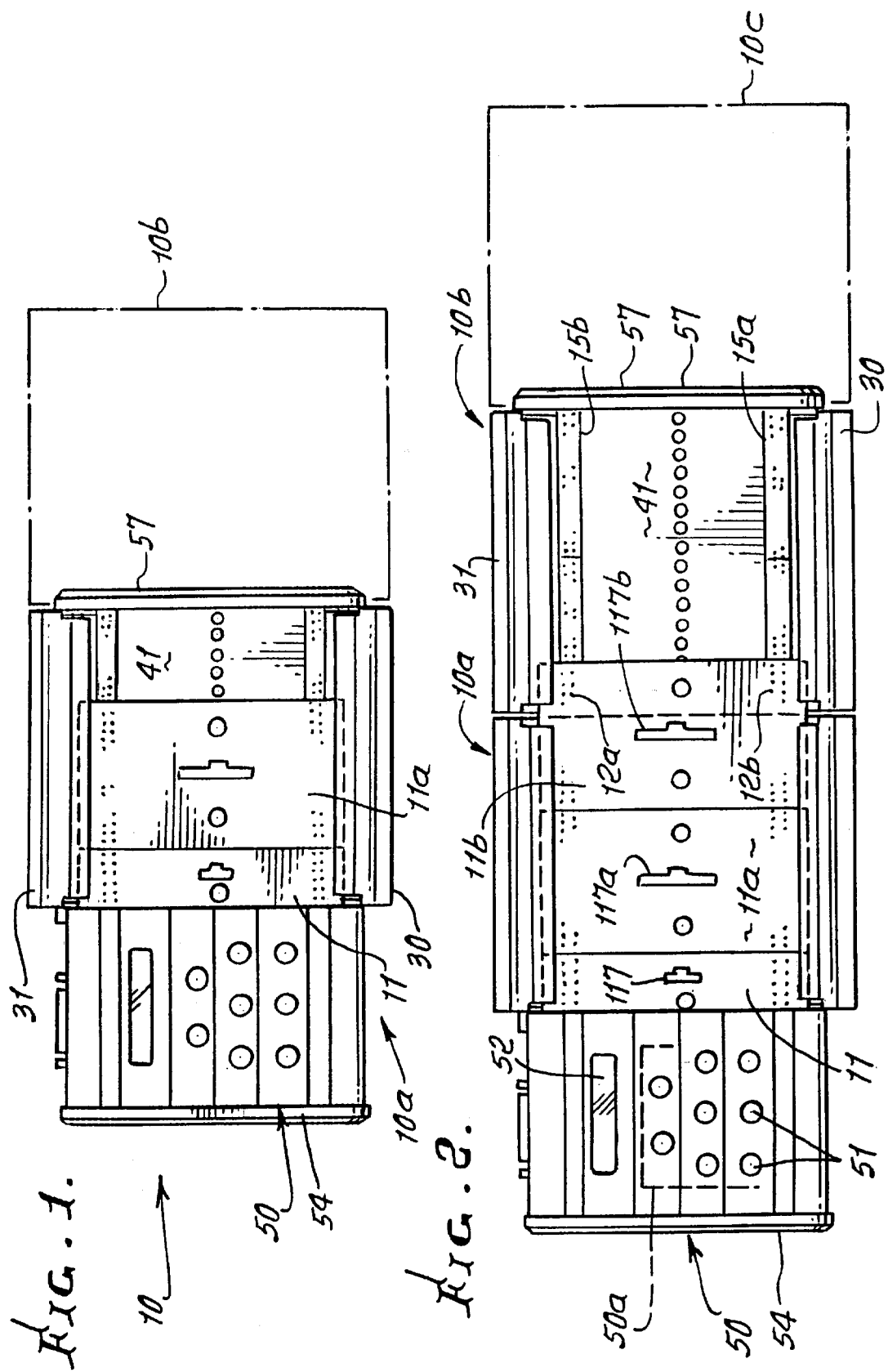

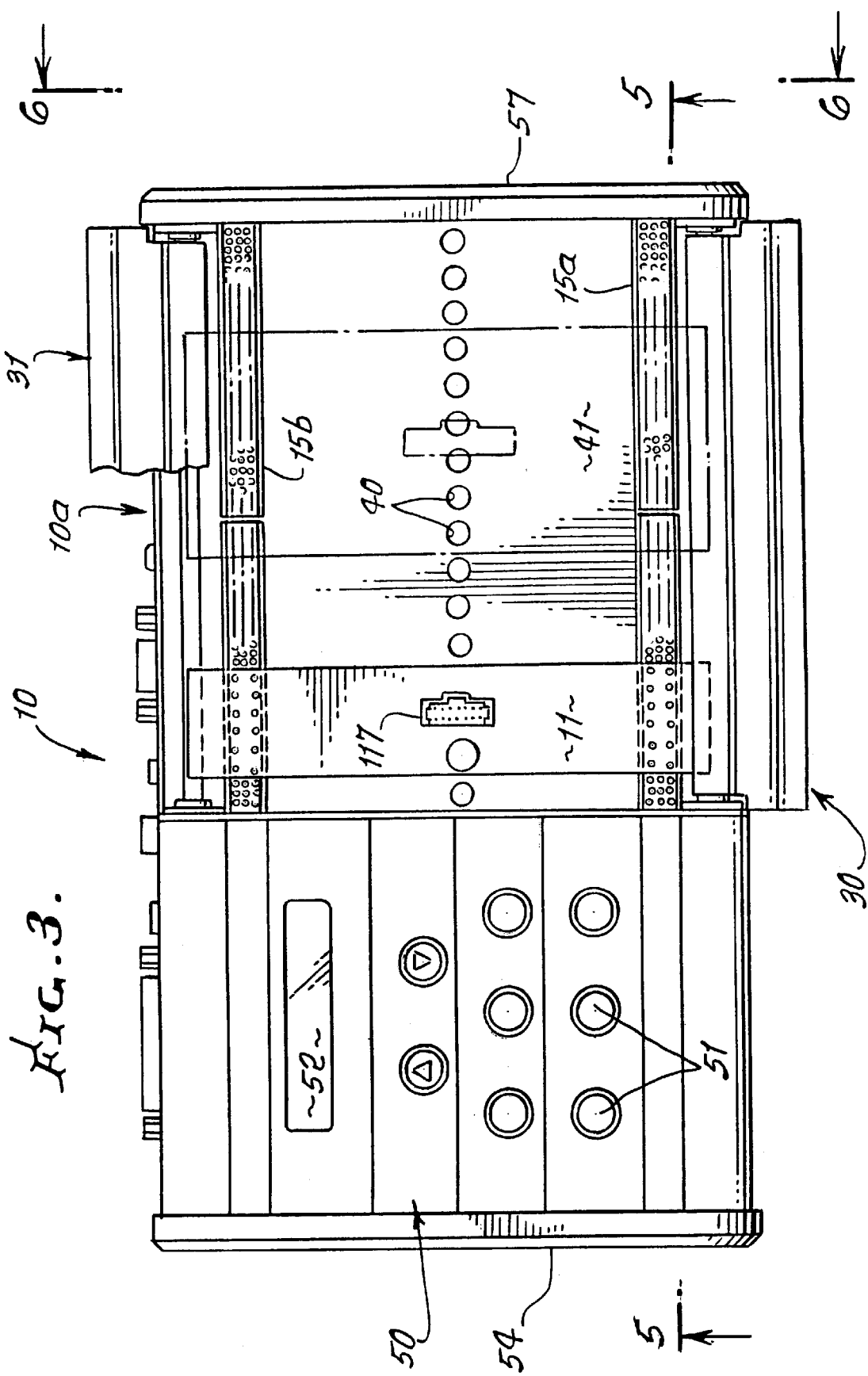

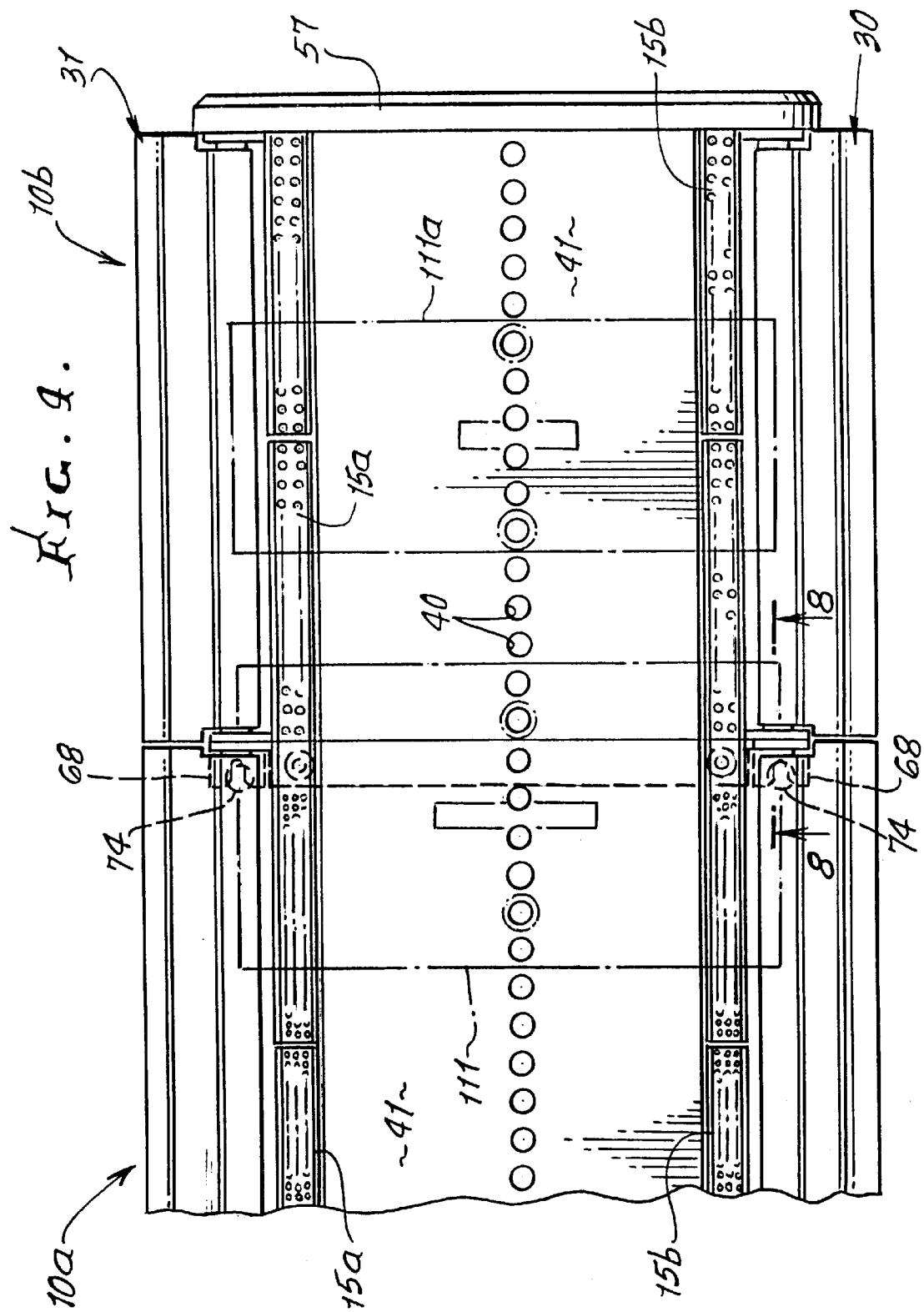

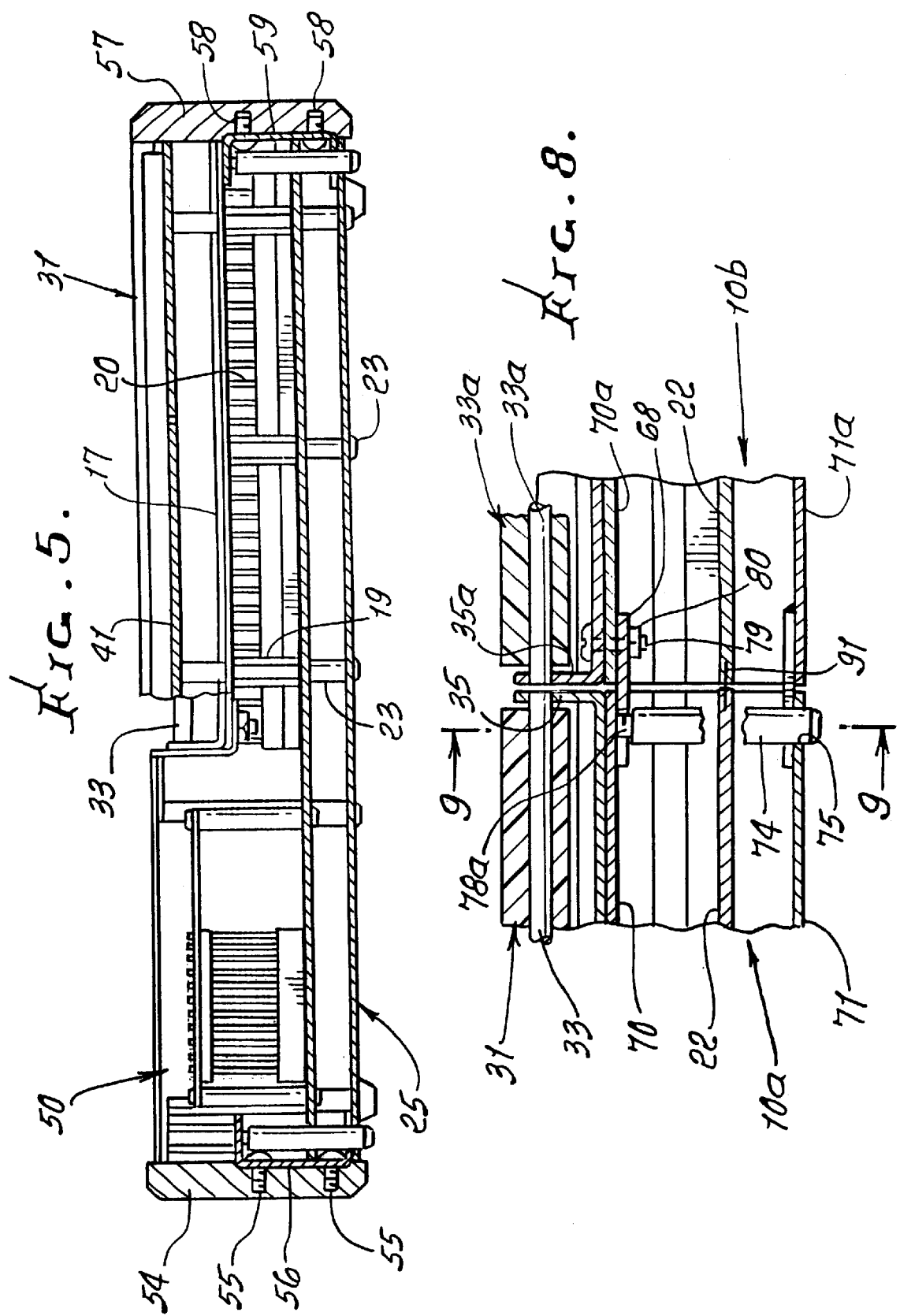

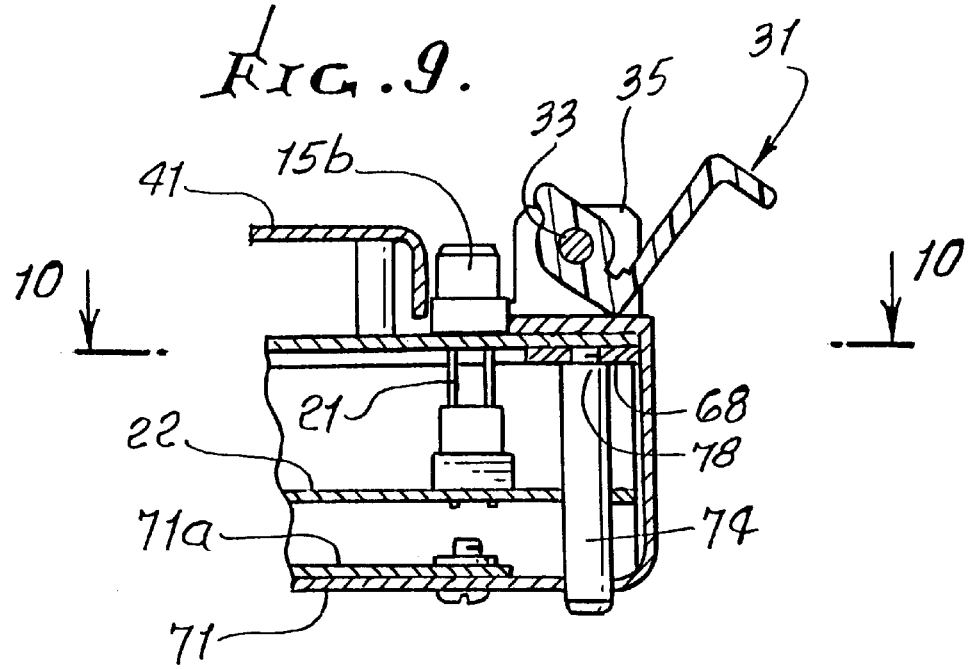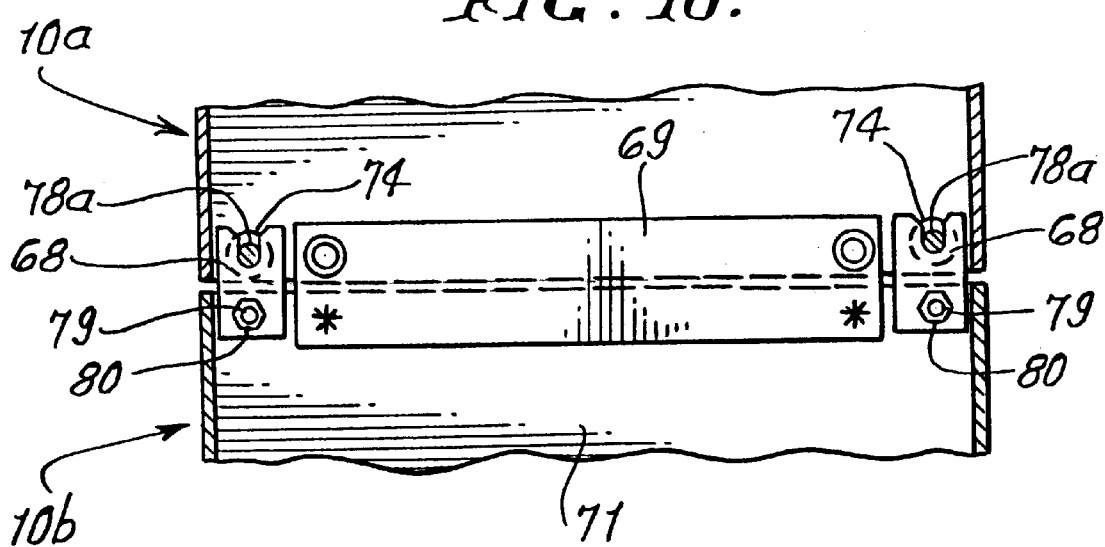

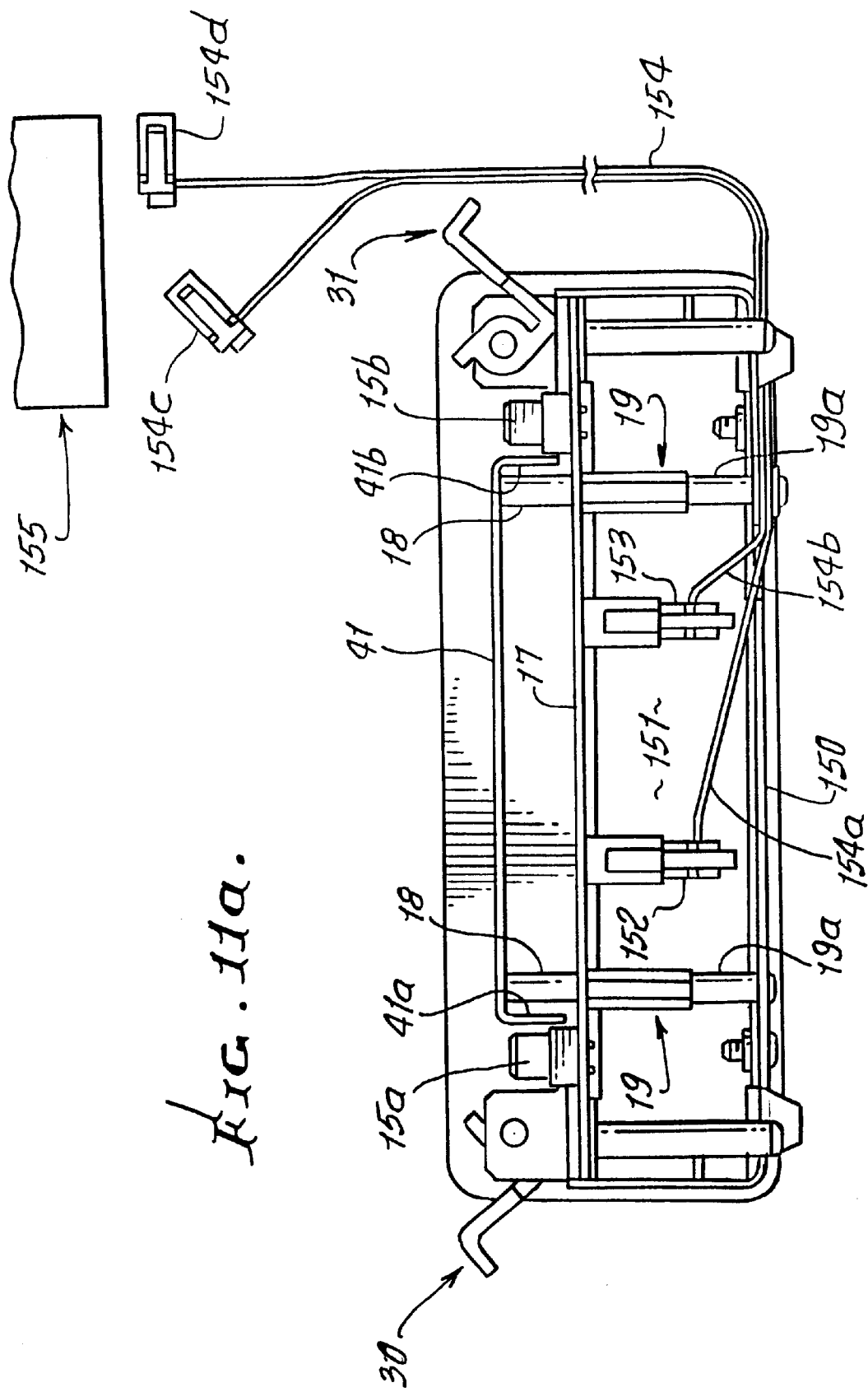

INTERFACE FOR CABLE TESTING

This application is a continuation of U.S. Ser. No. 09/898,281, filed Jul. 2, 2001, pending, which is a continuation of Ser. No. 09/253,553, filed Feb. 19, 1999, now issued U.S. Pat. No. 6,255,828 B1.

BACKGROUND OF THE INVENTION

This invention relates generally to the testing of cables and wire harnesses, and more particularly concerns a novel tester apparatus that is expansible, as in modular mode or modes, to accommodate testing of different size wire harnesses, or multiple connectors on wire harnesses.

Cable testers are used to verify electrical specifications of conductors in cable and wire harnesses, as for example circuit continuity. In the past, different size testers were required in order to test different size wire harnesses.

Typically, a circuit tester apparatus tests an electric circuit by testing the electrical connections between all of the electrical points in that circuit. The tester apparatus includes elements called "test points" that are electrically connected to the electrical points in the circuit while the circuit is being tested. Typically, the tester apparatus includes one test point for each point in the circuit that is being tested, and so the number of test points in the tester apparatus must equal or exceed the number of points in the circuit being tested. A circuit with a large number of points can be tested only by a tester apparatus that has an equally large number of test points. Since one of the most expensive components of a tester apparatus is its test point circuitry, the cost of a tester apparatus is directly related to its number of test points.

Prior art tester apparatus uses carrier elements to which the circuit points of a cable or wire harness are electrically connected in order to be tested. The carrier elements include first electrical connectors which comprise terminal pins, and the tester apparatus includes second electrical connectors which comprise terminal pin receptacles. The carrier elements are interfaced to the second electrical connectors by interfitting the first electrical connectors to the second electrical connectors.

In prior art apparatus, it is acceptable for the number of circuit points to which an individual carrier element is connected to be less than the number of receptacles in the second electrical connector to which that carrier element is interfaced. However, in this situation, some of the receptacles in that second electrical connector are not utilized, and, as a result, some of the test points that are assigned to that particular second electrical connector are not utilized. This means that some of the test point capacity in the testing apparatus is wasted.

If such prior art tester apparatus is configured to include multiple carrier elements, and if the maximum number of circuit points to which each carrier element can be connected is less than the number of receptacles in each second electrical connector, then a certain number of the test points associated with each second electrical connector is wasted. As a result, because each test point in the tester apparatus is assigned to a specific second electrical connector, and because the tester apparatus must include one second electrical connector for each carrier element, it is necessary for the tester apparatus to have a total number of test points that is significantly greater than the number of points in the circuit being tested. This means that a significant proportion of the test point capacity of the tester apparatus is wasted, and the cost of the tester apparatus is higher than it would be if the number of test points were limited to the number of points in the circuit being tested.

There is continuing need for simple, low-cost, tester apparatus that can readily interface to different size wire harnesses, and to multiple connectors to be simultaneously tested. This invention improves upon the tester apparatus disclosure in U.S. Pat. No. 5,072,185 to Rockwell.

SUMMARY OF THE INVENTION

It is a major object of the invention to provide improved interface and tester apparatus meeting the above needs. Basically, the apparatus of the invention is useful in testing electrical cables or wire harnesses. One or more carrier elements, such as adapter cards, are employed, having first electrical connectors, and the apparatus in one form comprises:

a) multiple base sections connected in end to end longitudinal sequence, b) and second electrical connectors carried by said sections and positioned to interfit said first electrical connectors when said element or elements are assembled to said multiple sections.

As will be seen, connectorized adapter cards of different sizes, or two or more of the connectorized adapter cards, can be accommodated, as by bridging one or more of the sections assembled together in end-to-end relation. Two or more adapter cards can also be accommodated in a single section depending on the size of the adapters. In this regard, the second electrical connectors carried by end-to-end sections are in generally longitudinal alignment, to provide modularity.

It is another object of the invention to locate the second electrical connectors in two laterally spaced rows, the connectors in each row being in generally longitudinal alignment successively of said sections. One row of the second electrical connectors is also contemplated, as will appear.

Yet another object is to provide second electrical connectors in the form of receptacles configured to receive the first connectors. Such first connectors typically comprise terminal pins carried by the circuit board or boards that may or may not overlap or bridge successive sections. Such circuit boards are also referred to herein as adapter cards, and vice versa. Alternatively, the first electrical connectors may comprise receptacles carried by the adapter card or cards, and the second electrical connectors may comprise terminal pins receivable by receptacles.

A further object is to provide simple, plug-in type end-to-end connection of successive sections, for ready expansion of the tester apparatus. Alignment plates may be employed proximate plug-in connectors to aid in preventing mis-alignment of successive expansion sections, as in a row.

The method of employing circuit tester apparatus for testing wire harnesses via first electrical connectors, on one or more carrier elements such as adapter cards, includes the steps:

a) providing a base section or sections to which one or more adapter cards may be assembled, b) and providing second electrical connectors carried by said section or sections and positioned to interfit the first electrical connectors when the card or cards are assembled to the section or sections, at least one of such second electrical connectors configured to interfit, simultaneously, at least two of the first electrical connectors.

The method may also include adding a second of said sections to, and endwise of, a first of said sections, and employing at least one of the adapter cards associated with the cards and sections to interconnect first and second electrical connectors.

Testing via the board or card circuitry is carried out after the boards are applied, as referred to.

In the present invention, each second electrical connector is configured as a continuous connector that can be interfitted simultaneously to multiple first electrical connectors. This allows multiple first electrical connectors, of either the same size or of different sizes, to be "stacked", end-to-end, onto a single second electrical connector. Accordingly, multiple carrier elements, of either the same size or of different sizes, can be interfaced simultaneously to a single second electrical connector.

Multiple base sections can be connected in end-to-end longitudinal sequence, in which case the row or rows of second electrical connectors on the multiple sections are aligned longitudinally, and each row of second electrical connectors on the multiple sections becomes a single, extending, continuous connector that runs the length of the successive sections and can be interfitted simultaneously to numerous first electrical connectors or can be interfitted to a single first electrical connector that has a quantity of terminal pins that is greater than the quantity of receptacles in any one of the aligned second electrical connectors.

In addition, two successive second electrical connectors that extend as one continuous connector can be interfitted simultaneously to one first electrical connector, so that the one first electrical connector overlaps or bridges the two second electrical connectors. This can be achieved with several different configurations of the tester apparatus. In one configuration, the two second electrical connectors are longitudinally aligned connectors that are included in the same base section. In another configuration, there are two base sections connected in end-to-end longitudinal sequence, and one of the second electrical connectors is included in the first base section and the other second electrical connector is included in the second, successive base section. In both configurations, the number of pins in the first electrical connector can be greater or less than the number of receptacles in each second electrical connector.

The following are examples of various configurations of the invention in which the number of second electrical connectors is different from the number of carrier elements:

EXAMPLE 1

If the tester apparatus includes three carrier elements (A, B, and C), and if the maximum number of circuit points to which each carrier element can be connected is less than one third of the number of receptacles in a single second electrical connector (A), then all three carrier elements A, B, and C can be interfaced simultaneously to the single second electrical connector AA.

EXAMPLE 2

If the tester apparatus includes three carrier elements (A, B, and C), and if the number of circuit points to which each of carrier elements A, B, and C can be connected is less than two thirds of the number of receptacles in each of two successive second electrical connectors (AA and BB), then all three carrier elements A, B, and C can be interfaced simultaneously to the two second connectors AA and BB, with carrier element A interfaced to second connector AA, carrier element B overlapping both second connectors AA and BB and interfaced to both, and carrier element C interfaced to second connector BB. The two second connectors AA and BB can be successive connectors that are included in the same base section, or, if there are two base sections connected in end-to-end longitudinal sequence, then second connector AA can be included in the first base section and second connector or BB can be included in the second section.

EXAMPLE 3

If the tester apparatus includes one carrier element (A), and if the number of circuit points to which carrier element A is to be connected exceeds the number of receptacles in each second electrical connector, then carrier element A can be interfaced simultaneously to multiple, aligned second electrical connectors, as long as the total number of receptacles in all of the aligned second electrical connectors equals or exceeds the total number of circuit points to which carrier element (A) is to be connected.

The present invention provides numerous benefits over circuit testers in the prior art. These benefits include:

- In this invention, the number of carrier elements can exceed the number of second electrical connectors, and vice versa.
- In this invention, the maximum number of circuit points to which a carrier element can be connected can be less than the number of receptacles in the second electrical connector to which that carrier element is interfaced, without causing a certain number of the test points associated with that second electrical connector to be wasted.
- By configuring the second connector as a continuous connector, so that multiple carrier elements can be interfaced simultaneously to each second electrical connector, this invention allows the use of multiple carrier elements and multiple second electrical connectors without requiring that a certain number receptacles in each second electrical connector (and thus a certain number of test points) be wasted. Even in cases in which the maximum number of circuit points to which each carrier element can be connected is less than the number of receptacles in each second electrical connector, this invention does not require that a certain number of the test points associated with each second electrical connector be wasted.
- The maximum required test point capacity of the tester apparatus can be limited to approximately the number of points in the circuit being tested.

These and other objects and advantages of the invention, as well as the details of an illustrative embodiment, will be more fully understood from the following specification and drawings, in which:

DRAWING DESCRIPTION

FIG. 1 is a top plan view of one tester section, and showing adapter cards plugged in to that section;

FIG. 2 is like FIG. 1, but also shows expansion sections aligned in end-to-end relation to the one section, and adapter cards, one of which overlaps two sections;

FIG. 3 is an enlarged view like FIG. 1, and showing an end cover at the end of the section;

FIG. 4 is a view like FIG. 3, and showing expansion unit assembled in position, and to which the end cover is applied;

FIG. 5 is an enlarged section taken on lines 5—5 of FIG. 3;

Figure 6:
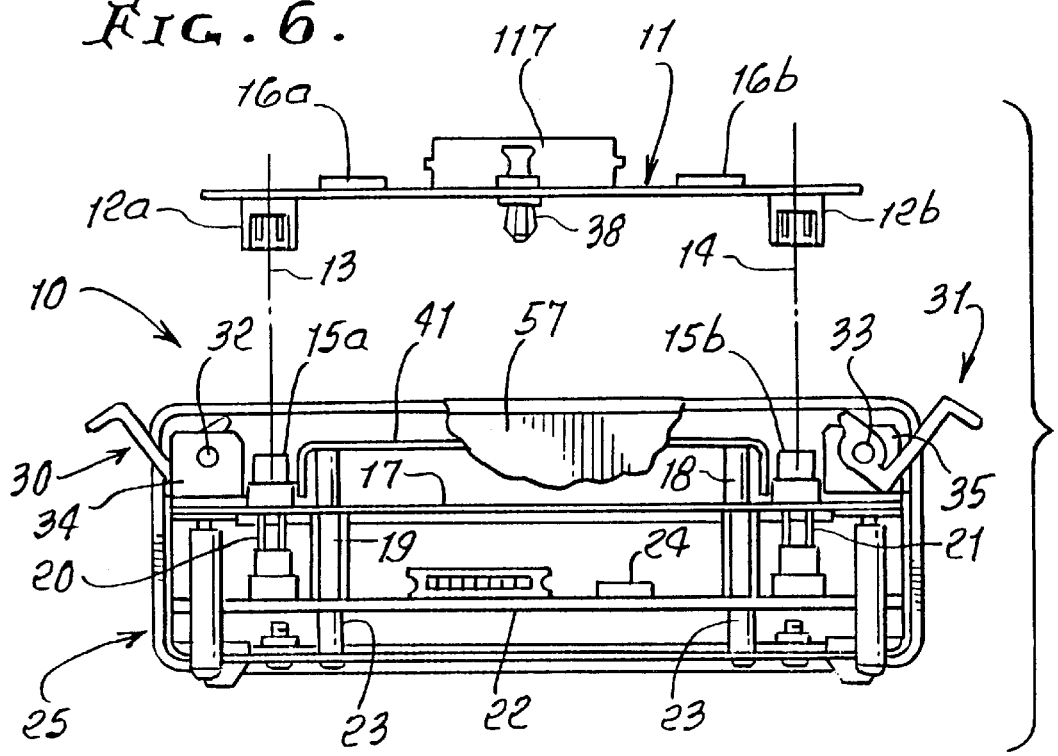
FIG. 6 is an end view taken on lines 6—6 of FIG. 3, and also showing an adapter card positioned to be plugged in to the tester.
Figure 7:
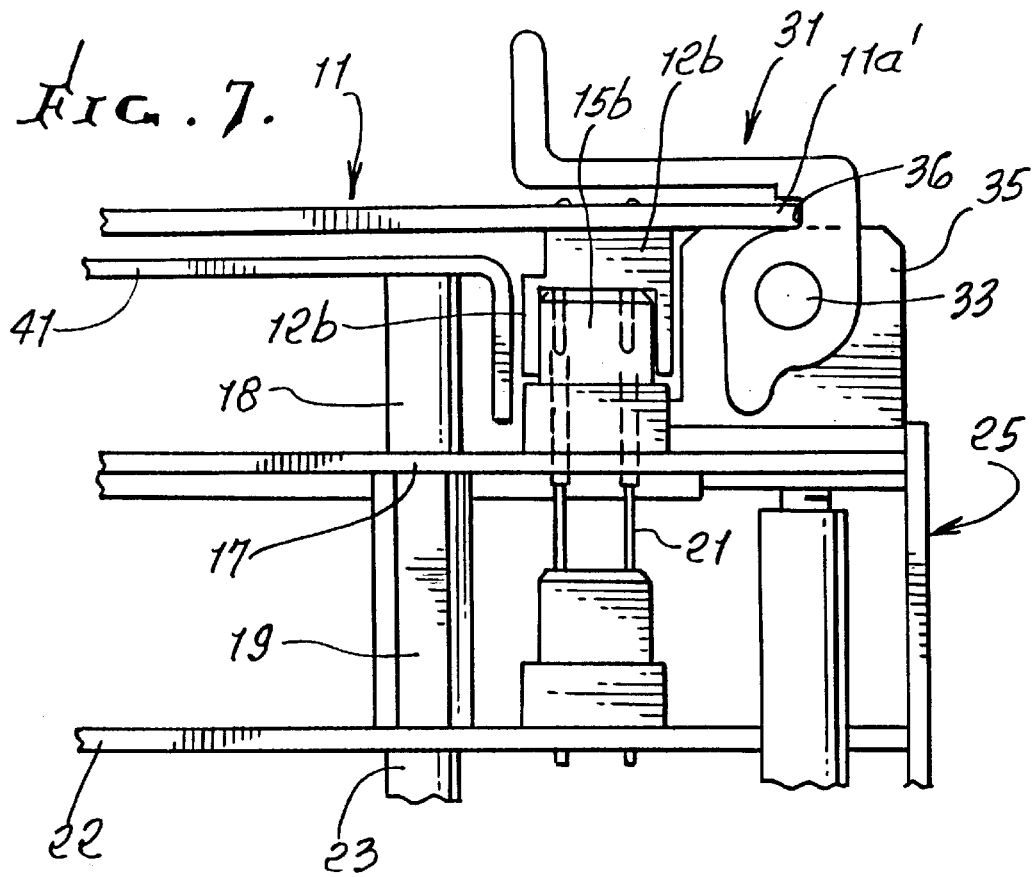
Figure 6A:
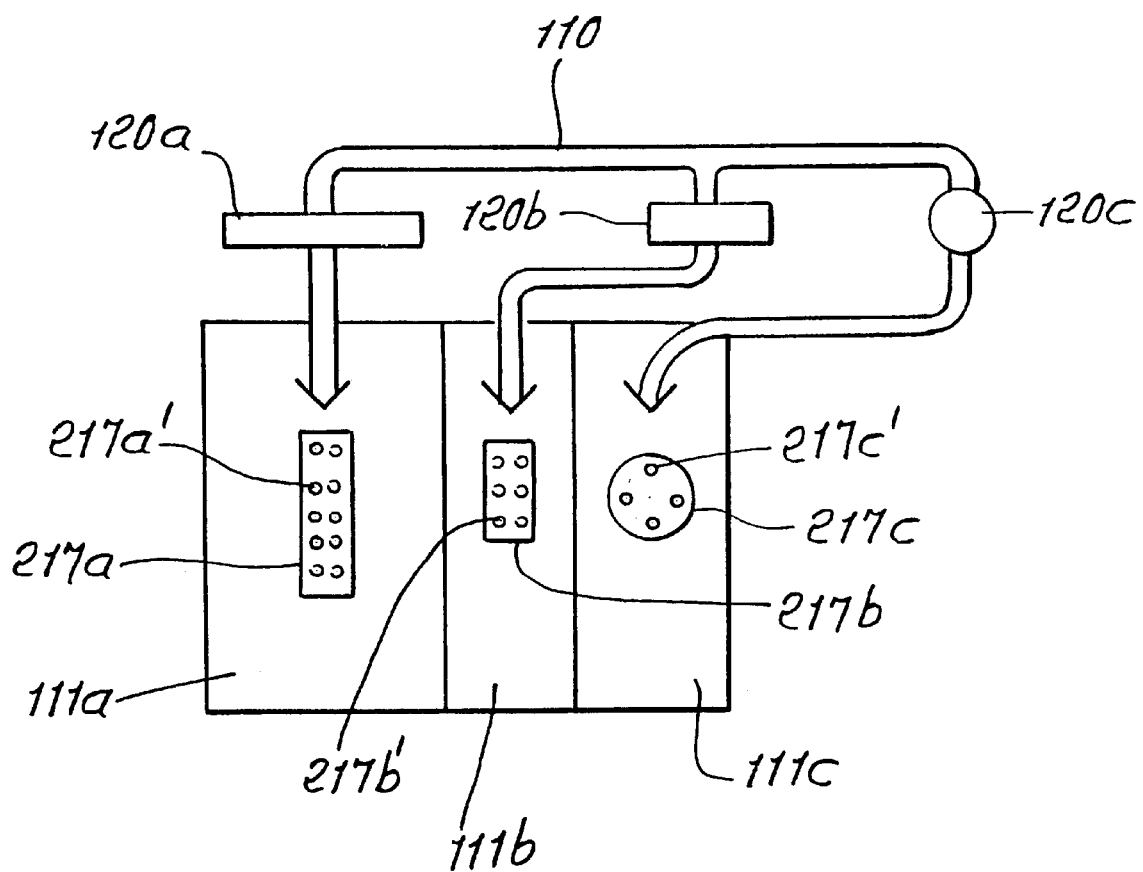
Figure 11:
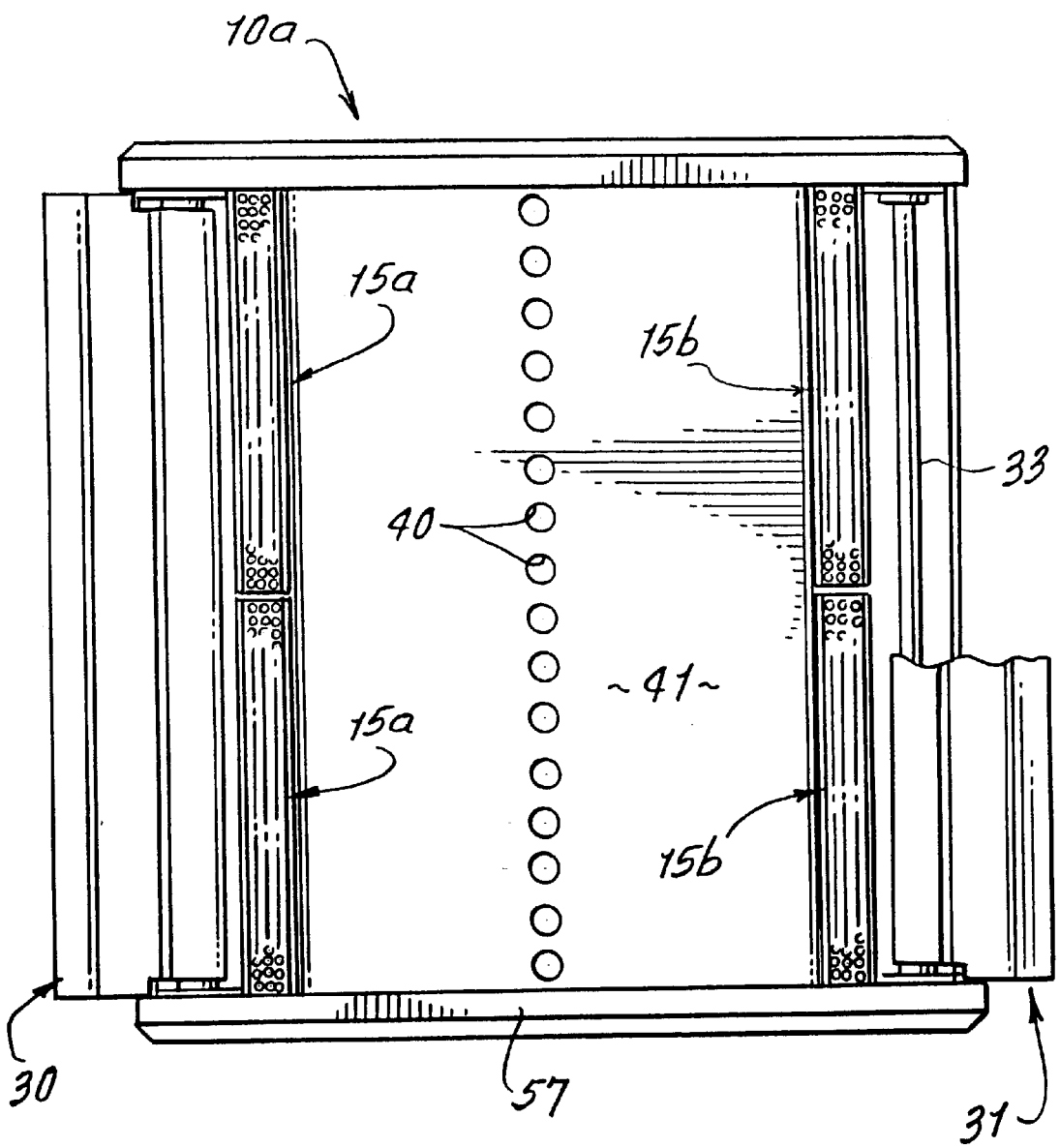

FIG. 6a schematically shows harness plugs connectable to adapter cards;

FIG. 7 is a fragmentary elevation showing clamping of an adapter to the tester;

FIG. 8 is a fragmentary elevation showing end-to-end connection of two tester base sections;

FIG. 9 is an elevation taken in section on lines 9—9 of FIG. 8;

FIG. 10 is a plan view taken in section on lines 10—10 of FIG. 9;

FIG. 11 is a view like FIG. 1, showing a modification; and

FIG. 11a is a view of the modification, and like FIG. 6.

DETAILED DESCRIPTION

Referring first to FIGS. 1, 3 and 6, the preferred cable or harness tester apparatus 10 employs testing circuitry on one or more adapter cards, one such adapter card indicated at 11. FIG. 6 shows an adapter card in the form of a connectorized circuit board positioned above the apparatus 10, and first electrical connectors 12a and 12b above and aligned (see axes 13 and 14) with second electrical connectors 15a and 15b. The connectors typically extend in lengthwise rows. Connectors 12a and 12b are shown as terminal pins projecting below card or board 11, and it will be understood that card or board 11 carrier circuitry schematically indicated generally at 16a and 16b is connected with pins 12a and 12b, and is to be electrically connected with harness mating connector or connectors 117 on card 11. A second card 11a is shown in FIG. 1, and FIG. 2 shows an additional card 11b. Such cards may have different widths, in a longitudinal direction, as shown. Harness connectors are seen at 117, 117a and 117b.

FIG. 6a shows three typical adapter cards 111a, 111b, and 111c, having harness mating connectors 217a, 217b and 217c thereon. Card width is determined by the number of pins 217a', 217b' and 217c' in the connectors. A harness 110 to be tested has connector plugs 120a, 120b and 120c respectively matingly connectable to 217a, 217b and 217c.

Connectors 15a and 15b in FIG. 6, such as sockets or receptacles, are carried by apparatus 10, as on a panel 17 supported at 19. Plate 41 is supported at 18, as seen in FIG. 7. The sockets may be electrically connected at 20 and 21 with test circuitry 24 on a lower, interior board 22, supported at 23. Circuitry may be electrically connected to circuitry 50a at the controls 50. See FIG. 2. The connectors 15a and 15b may be circularly arranged. Board 22 may be a printed circuit board. A housing or frame is provided at 25. That housing and the interior elements 15a and 15b, as well as other elements, are referred to as a first base section 10a in FIG. 2. An extension base section appears at 10b. One important feature of the invention is the provision for connecting multiple base sections in end-to-end sequence, and modular base sections may be provided for this purpose, although the base sections may vary in their external and/or interior construction.

FIGS. 3, 6 and 7 also show provision of elongated toggle clamps 30 and 31 laterally spaced as shown and pivotably connected at 32 and 33 to base section structure 34 and 35. When the clamps are rotated, as illustrated by clamp 31 in FIG. 7, they clamp the board 11 to the base section, with terminal pins 12a and 12b received telescopically in the respective sockets 15a and 15b. A notch 36 in the clamp 31 receives the edge 11a' of the board 11 to hold the board in down position, and to push the board pins 12a and 12b upwardly from the base section receptacles 15a and 15b, with high leverage, when the toggles are rotated upwardly. A locating/locking pin 38 is also carried by the board 11, laterally mid-way between the terminal pins 12a and 12b, as seen in FIG. 6, to be received in a locating hole 40 in the top plate 41 of each base section in FIG. 3. Holes 40 are spaced longitudinally along the plate so that when pin 38 is received in a selected hole 40, the terminal pins 12a and 12b will interfit selected receptacles 15a and 15b, for testing. Multiple such pins 38 may be provided, and they may comprise snap latches which locate and lock the cards.

A control means 50 is provided at one end of the base section 10a, as seen in FIG. 1. It has controls such as keys 51 to enter test data or routines into memory or circuitry 50a in the means 50, to control the test sequencing, as also seen in FIG. 2. A visual display, as for example a liquid crystal display, is shown at 52. An end cover 54 is provided at the end of the means 50 and may be retained in position as by fasteners 55 and bracket 56. Another end cover 57 is provided at the opposite end of the section 10a, and may be removably retained in position, as by fasteners 58 and a bracket 59. See FIG. 5.

FIGS. 1 and 2 also show possible provision of a second base section 10b, longitudinally positioned from section 10a, after attachment to the latter, when required. FIG. 4 shows how that expansion unit, i.e. section 10b, when actually attached to 10a, expands the capacity of the apparatus 10, so that a larger adapter (circuit) card, or multiple adapter cards (or boards) can now be connected to the sections 10a or 10b, or both, with or without bridging of the two sections. FIG. 4 shows a circuit board 111 bridging the joint between two base sections 10a and 10b, and another circuit board 111a attached to section 10b, in the manner previously described. FIG. 2 also shows a third base section 10c or expansion unit endwise longitudinally attached to base expansion section 10b. End cover 57 is appropriately removed to permit such endwise sequential attachment, following which cover 57 is applied to the endmost expansion unit. See FIG. 5.

Referring now to FIGS. 8 and 10, they show lower mounting plate 69 integrally connected to the body structure 71a of a base section 10b. Two slotted guide clips 68 secured by threaded studs 79 as from structure 35a through openings in body structure 70a. The guide clips project horizontally and longitudinally leftwardly into the opened end of the section 10a, to align and engage the corresponding body structures 70 and 71 of the base section 10a, thereby aligning the two sections in end-to-end registration, longitudinally, so that neither section is vertically or horizontally offset relative to the other. A fastener 74 is advanced upwardly in an opening 75 in body or housing 71 of section 10a, then threaded to a stud 78a as from structure 35 through opening in body structure 70 and into a slot in guide clip 68. Rotation of the fastener secures the attachment, since shoulder 78 on the fastener comes into tight engagement with mounting clip 68 also seen in FIG. 9. The clip is held to body structure 70a by a nut 80 attached to stud 79 from 35a. The second clip 68 at the opposite lateral side, is attached to a stud from 34a. When section 10b, plate 69, and clips 68 are disconnected from section 10a, and removed, the end cover 57 can be re-applied to this end of section 10a, as in FIG. 5. Frame pins or supports appear at 23. FIG. 10 also shows endwise guide clips 68 and guide studs 78a from 34 and 35 in relation to the position of the fastener 74 seen in FIGS. 8 and 10.

Referring again to FIG. 8, it also shows two PCB's, i.e. circuit boards 22 on the successive sections 10a and 10b, the boards extending into end-to-end proximity, with circuit connector pin or pins 91 interconnecting the boards, so that the controls 50 are in electrical communication with the board circuitry on each section, as when added.

FIGS. 11 and 11a are generally like FIGS. 1 and 6, corresponding elements bearing the same and identifying numbers. One difference consists in the illustration of only one base section 10a. End cover 57 can be removed to enable addition of a second base section 10b in the manner as referred to above. One or more carrier elements such as adapter cards carrying first electrical connectors, can be connected to section 10a, depending on the width of such cards. Such cards are shown at 11, 11a, etc. in FIG. 2. The first electrical connectors are connectable with second electrical connectors in two longitudinally extending rows and indicated at 15a and 15b, which are laterally spaced apart.

The connectors 15a and 15b are shown as electrical receptacles carried by a horizontal panel or circuit board 17, supported at 19, with supports 19 connected at 19a to horizontal frame part 150. Located in space 151 between 17 and 150 are third connectors 152 and 153, carried by board 17. Additional such connectors can be used. Circuitry on 17 electrically connects to 15a and 15b, and to 152 and 153. A multi-conductor cable 154 has multiple terminal strands such as at 154a and 154b extending into space 151 for electrical connection to 152 and 153. The multi-conductor cable extends adjacent 150 and to the exterior, with cable terminals 154c and 154d connectable to external test or control circuitry indicated at 155. That circuitry can comprise the control circuitry referred to at 50 in FIG. 1, whereby the test controls (for example sequencing of continuity circuits) can be remotely located. The adapter cards and other circuitry can employ electrical wiring, or optical fiber, or other multiple elements to transmit electrical and/or light signals.

In this regard, it should be understood that FIGS. 1–10 depict an apparatus that includes both a tester controller and second electrical connectors. One of the benefits of this apparatus is that is provides convenience, because the tester apparatus always includes a tester controller and built-in second connectors, and so the tester apparatus can always be interfaced to adapter cards that have first connectors.

The apparatus of FIGS. 11 and 11a includes second connectors, but it does not include an integrated tester controller. In order for this apparatus to be used, it must be connected to a separate tester controller. Typically, the apparatus of FIGS. 11 and 11a is connected to a first tester controller and is used in conjunction with the first tester controller and can be connected to a second tester controller for use in testing cables and harnesses. It may be necessary to use the second tester controller because the second tester controller may have a different testing capacity from the first tester controller or may perform a different type of test form that performed by the first tester controller.

One of the benefits of the apparatus of FIGS. 11 and 11a is that it increases efficiency. It allows the use of various types of tester controllers without having to incur the additional cost that would be necessary if each tester controller had to have its own, built-in second connectors for interfacing to adapter cards.

A locating plate or panel 41 is carried by the base section, as by supports 18. It extends transversely into proximity at 41a and 41b with the two rows of receptacles 15b and 15a, as seen in FIG. 11a. Locating holes 40 are formed in the plate 41 to extend longitudinally, for reception of pins 38 projecting from the adapter cards, seen in FIG. 6.

We claim:
1. In circuit tester apparatus using one or more carrier elements, each said carrier element having one or more first electrical connectors, the combination comprising:
   a) multiple base sections connected in end-to-end longitudinal succession,
   b) multiple second electrical connectors carried by said multiple end-to-end connected base sections and positioned to interfit said one or more first electrical connectors,
   c) two of said second electrical connectors carried by two successive based sections and longitudinally elongated and longitudinally aligned to provide a continuous connector structure,
   d) said two longitudinally elongated and aligned second electrical connectors simultaneously interfitted to one of said first electrical connectors so that said one of said first electrical connectors bridges said two successive base sections.
2. In circuit tester apparatus using one or more carrier elements, each said carrier element having one or more first fiber optic connectors, the combination comprising:
   a) multiple base sections connected in end-to-end longitudinal succession,
   b) multiple second fiber optic connectors carried by said multiple end-to-end connected base sections and positioned to interfit said one or more first fiber optic connectors,
   c) two of said second fiber optic connectors carried by two successive base sections and longitudinally elongated and longitudinally aligned to provide a continuous connector structure,
   d) said two longitudinally elongated and aligned second fiber optic connectors simultaneously interfitted to one of said first fiber optic connectors so that said one of said first optic connectors bridges said two successive base sections.
3. The method of employing tester apparatus for testing electrical circuits via one or more carrier elements having one or more first electrical connectors, the method comprising the steps of:
   a) providing multiple base sections,
   b) connecting said multiple base sections in end-to-end longitudinal succession,
   c) providing multiple second electrical connectors carried by said multiple end-to-end connected base sections and positioned to be connected to said one or more first electrical connectors,
   d) providing a continuous connector structure comprising two of said second electrical connectors that are carried by two successive base sections and are longitudinally elongated and longitudinally aligned,
   e) and connecting said two longitudinally elongated and aligned second electrical connectors simultaneously to one of said first electrical connectors so that said one of said first electrical connectors bridges said two successive base sections.
4. The method of employing tester apparatus for testing fiber optic circuits via one or more carrier elements having one or more first fiber optic connectors, the method comprising the steps of:
   a) providing multiple base sections,
   b) connecting said multiple base sections in end-to-end longitudinal succession,
   c) providing multiple second fiber optic connectors carried by said multiple end-to-end connected base sections and positioned to be connected to said one or more first fiber optic connectors,
   d) providing a continuous connector structure comprising two of said second fiber optic connectors that are carried by two successive base sections and are longitudinally elongated and longitudinally aligned,
   e) and connecting said two longitudinally elongated and aligned second fiber optic connectors simultaneously to one of said first fiber optic connectors so that said one of said first fiber optic connectors bridges said two successive base sections.

* * * * *

UNITED STATES PATENT AND TRADEMARK OFFICE
CERTIFICATE OF CORRECTION

PATENT NO.    : 6,593,750 B2
DATED         : July 15, 2003
INVENTOR(S)   : Kenneth N. Rockwell and Roy G. Brant It is certified that error appears in the above-identified patent and that said Letters Patent is hereby corrected as shown below:

Title page,
Item [63], Related U.S. Application Data, should read:
-- Continuation of application No. 09/898,281, filed on Jul. 2, 2001, now Pat. No. 6,420,881, which is a continuation of application of Ser. No. 09/253,553, filed on Feb. 19, 1999, now Pat. No. 6,255,828. --

Signed and Sealed this

Third Day of August, 2004

JON W. DUDAS
*Acting Director of the United States Patent and Trademark Office*